(12) United States Patent
Ohtsuka et al.

(10) Patent No.: US 7,935,624 B2
(45) Date of Patent: May 3, 2011

(54) FABRICATION METHOD OF SEMICONDUCTOR DEVICE HAVING A BARRIER LAYER CONTAINING MN

(75) Inventors: Nobuyuki Ohtsuka, Kawasaki (JP); Noriyoshi Shimizu, Kawasaki (JP); Yoshiyuki Nakao, Kawasaki (JP); Hisaya Sakai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 398 days.

(21) Appl. No.: 11/654,688

(22) Filed: Jan. 18, 2007

(65) Prior Publication Data
US 2007/0173055 A1 Jul. 26, 2007

(30) Foreign Application Priority Data

Jan. 20, 2006 (JP) .................... 2006-013155
Dec. 18, 2006 (JP) .................... 2006-340102

(51) Int. Cl.
*H01L 21/4763* (2006.01)
(52) U.S. Cl. ......... 438/627; 438/618; 438/622; 438/625
(58) Field of Classification Search .............. 257/756, 257/758, 762, 773; 438/618, 700, 622, 625, 438/627
See application file for complete search history.

(56) References Cited

U.S. PATENT DOCUMENTS

| | | | |
|---|---|---|---|
| 2003/0001271 A1* | 1/2003 | Uozumi | 257/758 |
| 2005/0218519 A1* | 10/2005 | Koike et al. | 257/756 |
| 2005/0272247 A1* | 12/2005 | Ikeda et al. | 438/618 |

FOREIGN PATENT DOCUMENTS

| | | |
|---|---|---|
| JP | 2-62035 A | 3/1990 |
| JP | 5-102318 A | 4/1993 |
| JP | 11-54458 A | 2/1999 |
| JP | 2001-326192 A | 11/2001 |
| JP | 2003-218198 A | 7/2003 |
| JP | 2005-277390 A | 10/2005 |

* cited by examiner

*Primary Examiner* — Bradley K Smith
*Assistant Examiner* — Marvin Payen
(74) *Attorney, Agent, or Firm* — Fujitsu Patent Center

(57) ABSTRACT

A method for fabricating a semiconductor device includes the steps of forming an opening defined by an inner wall surface in an insulation film, forming a Cu—Mn alloy layer in the opening, depositing a Cu layer on the Cu—Mn alloy layer and filling the opening with the Cu layer, and forming a barrier layer as a result of reaction between Mn atoms in the Cu—Mn alloy layer and the insulation film, wherein the step of forming the barrier layer is conducted by exposing the Cu layer to an ambient that forms a gaseous reaction product when reacted with Mn.

17 Claims, 15 Drawing Sheets

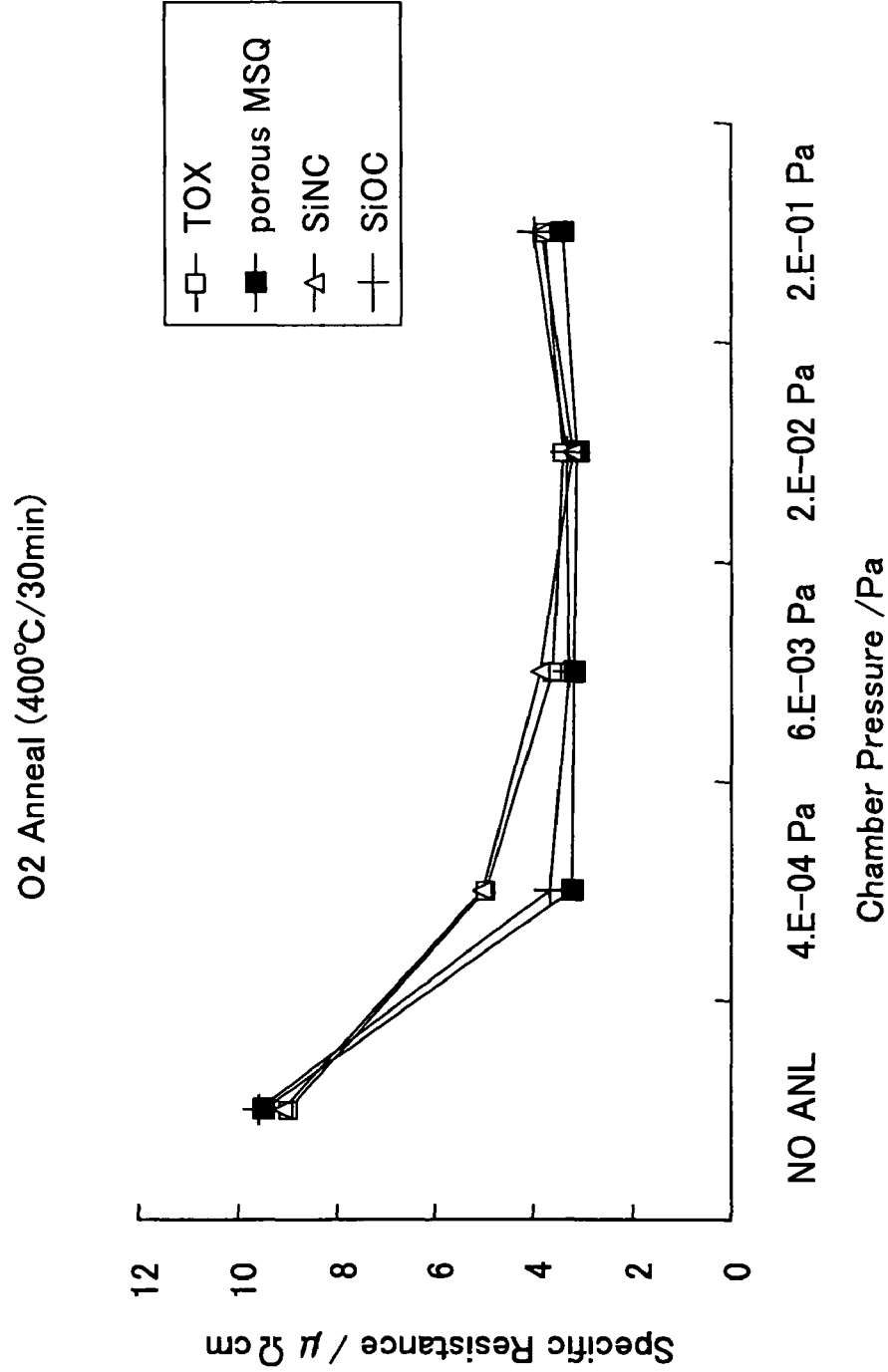

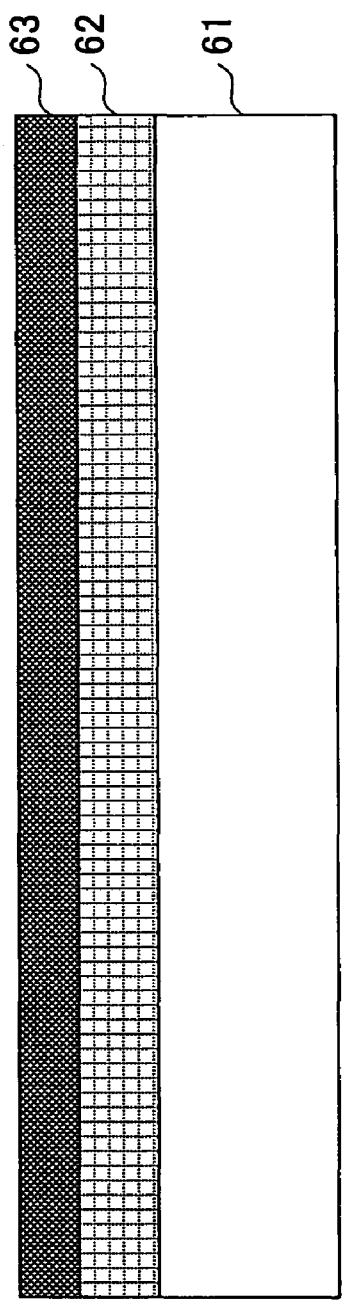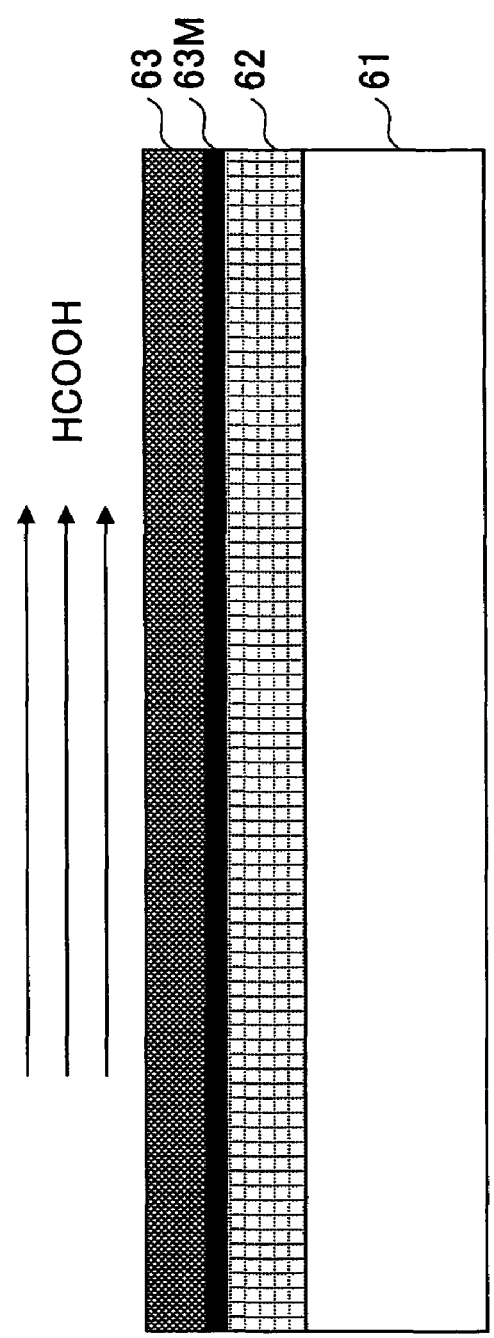
FIG.3A
FIG.3B

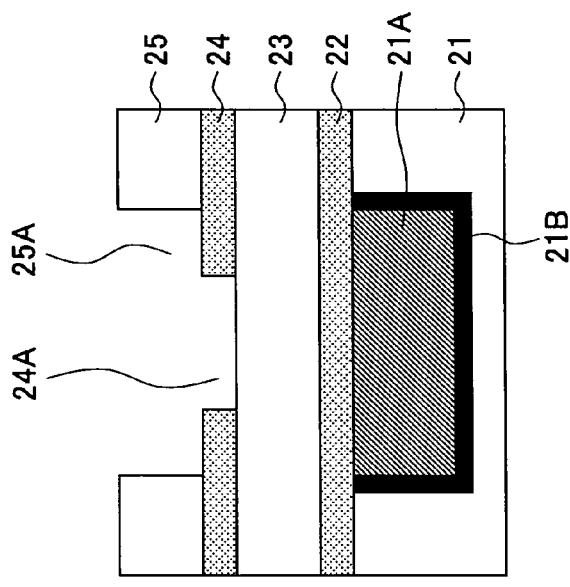
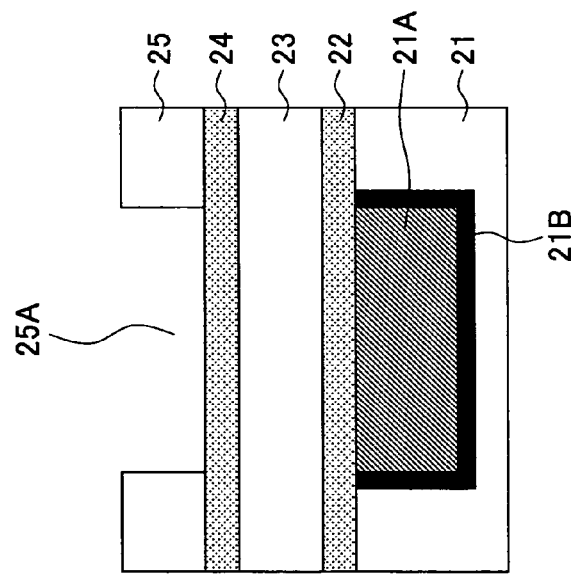
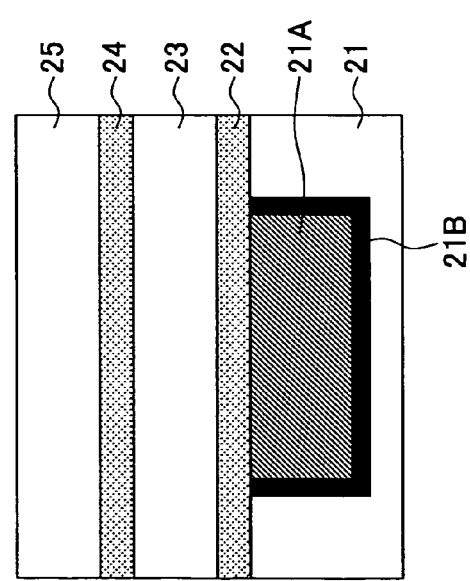

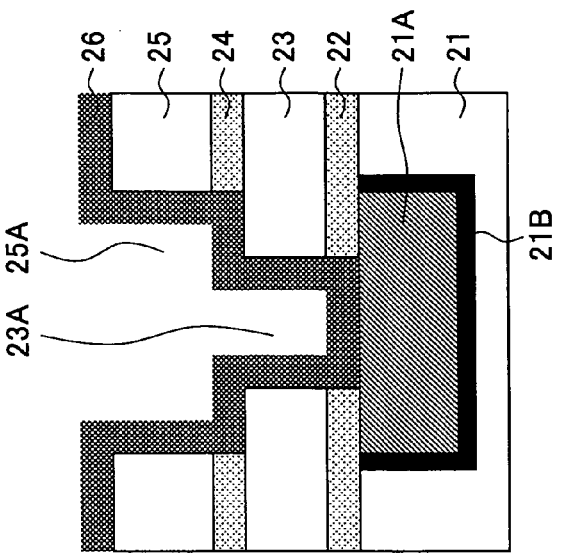
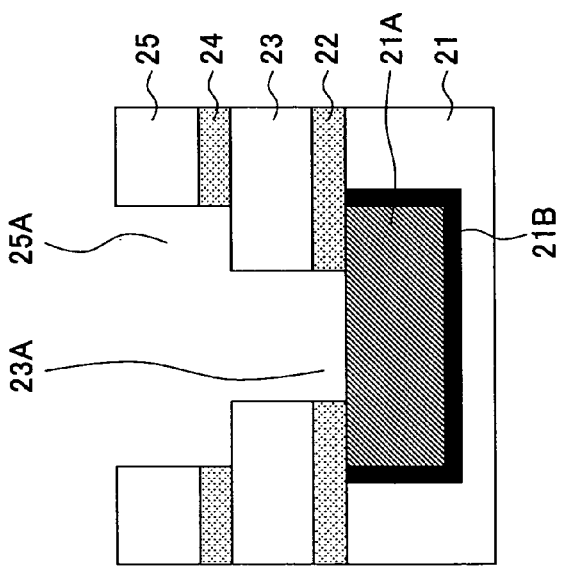
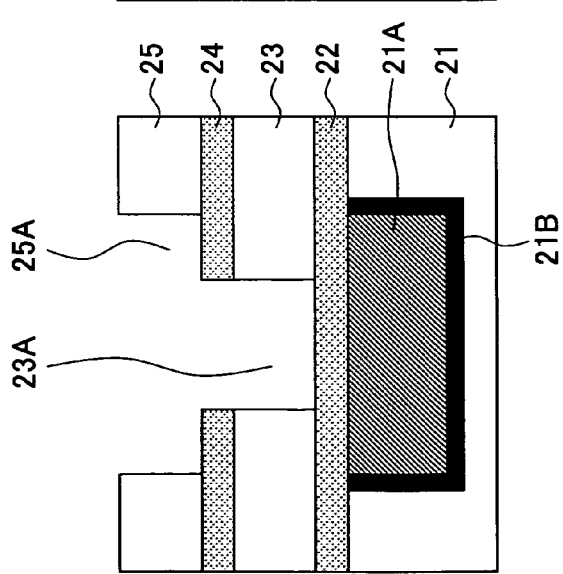

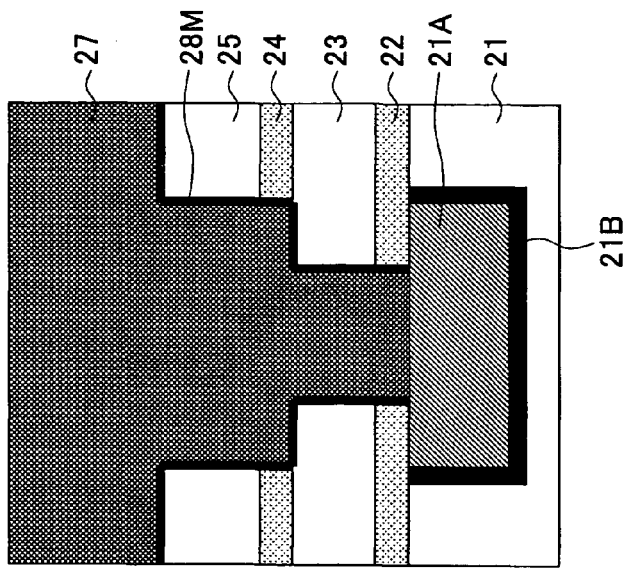
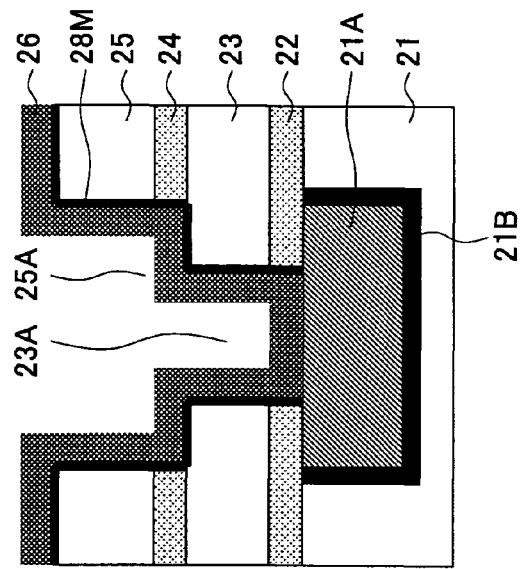
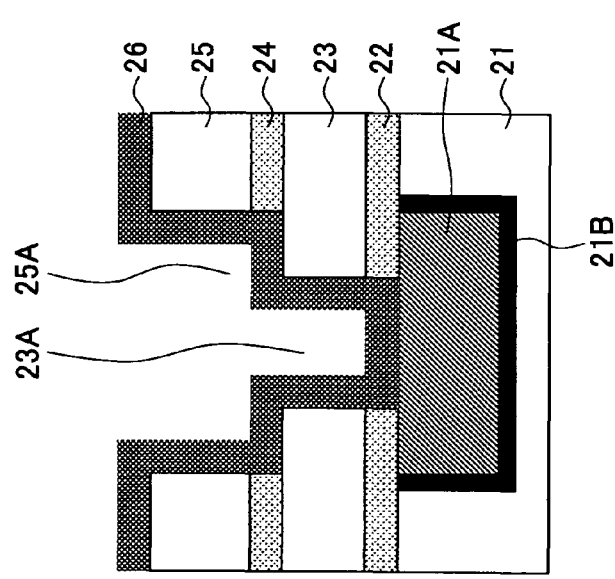

US 7,935,624 B2

FABRICATION METHOD OF SEMICONDUCTOR DEVICE HAVING A BARRIER LAYER CONTAINING MN

CROSS-REFERENCE TO RELATED APPLICATION

The present application is based on Japanese priority applications No. 2006-013155 and 2006-340102 respectively filed on Jan. 20, 2006 and Dec. 18, 2006, the entire contents of which are hereby incorporated by reference.

BACKGROUND OF THE INVENTION

The present invention generally relates to semiconductor devices and more particularly to the fabrication process of a semiconductor device having a multilayer interconnection structure.

In modern semiconductor integrated circuit devices, a large number of semiconductor elements are formed on a common substrate and a multilayer interconnection structure is used for connecting these semiconductor elements with each other.

In a multilayer interconnection structure, interlayer insulation films are laminated one another, wherein each interlayer insulation film is embedded with an interconnection pattern forming an interconnection layer. Thereby, an upper interconnection layer is connected to a lower interconnection layer by way of a via-contact formed in the interlayer insulation film.

With recent ultrafine and ultra high-speed semiconductor devices in particular, a low dielectric constant film (so-called low-K dielectric film) is used for the interlayer insulation film together with a low-resistance Cu pattern that forms the interconnection layer in the prospect of reducing the problem of signal delay caused in the multilayer interconnection structure.

Patent Reference 1 Japanese Laid-Open Patent Application 2-62035 official gazette
Patent Reference 2 Japanese Laid-Open Patent Application 2003-218198 official gazette
Patent Reference 3 Japanese Laid-Open Patent Application 2005-277390 official gazette
Patent Reference 4 Japanese Laid-Open Patent Application 2001-326192 official gazette
Patent Reference 5 Japanese Laid-Open Patent Application 11-54458 official gazette
Patent Reference 6 Japanese Laid-Open Patent Application 5-102318 official gazette

SUMMARY OF THE INVENTION

With such a multilayer interconnection structure in which Cu interconnection pattern is embedded in a low dielectric constant interlayer insulation film, it is practiced in the art to form the interconnection pattern by using a damascene process or dual damascene process in view of the difficulty of patterning a Cu layer by a dry etching process. In a damascene process or dual damascene process, it should be noted that interconnection trenches and via-holes are formed in an interlayer insulation film, and the interconnection trenches and the via-holes thus formed are filled with a Cu layer subsequently. Further, excessive Cu layer on the interlayer insulation film is removed by a chemical mechanical polishing (CMP) process.

Thereby, in order to avoid the problem of short-circuit caused by diffusion of Cu atoms from the Cu interconnection pattern into the interlayer insulation film, it is practiced in the art to cover the sidewall surface and the bottom surface of the interconnection trenches and the via-holes with a conductive diffusion barrier or so-called barrier metal film of a high-melting temperature metal such as Ta or W or a conductive nitride thereof, and the deposition of the Cu layer is made on such a barrier metal film.

On the other hand, with recent ultrafine and ultra high-speed semiconductor devices of 45 nm node or later, the size of the interconnection trenches and via-holes in the interlayer insulation film is reduced significantly with progress in the technology of device miniaturization, and thus, there is a need of reducing the film thickness of the barrier metal film formed on such highly miniaturized interconnection trenches or via-holes as much as possible in view of the need of decreasing the interconnection resistance and in view of relatively large specific resistance of barrier metal film. It should be noted that such a barrier metal film has to cover the sidewall surface and the bottom surface of the interconnection trench or via-hole continuously.

Conventionally, use of MOCVD (metal-organic CVD) process or ALD (atomic layer deposition) process is studied as the technology capable of forming an extremely thin continuous barrier metal film on such a highly miniaturized interconnection trench or via-hole.

On the other hand, because of use of metal organic gaseous source in MOCVD process or ALD process, the barrier metal film of high-melting temperature metal or nitride of such high-melting temperature metal formed with such a process suffers form the problem of poor film quality, and there arises a serious problem of poor adhesion between the barrier metal film and the interlayer insulation film, particularly in the case the interlayer insulation film is a low-k dielectric film characterized by low density such as an inorganic low-K dielectric film including an SiOCH film or SiC film or an organic low-K dielectric film.

Meanwhile, Patent Reference 3 discloses the technology of forming a diffusion barrier film by covering an interconnection trench or via-hole formed in an interlayer insulation film directly with a Cu—Mn-alloy layer, and forming a manganese silicon oxide layer having a composition represented as MnSixoy at an interface between the Cu—Mn alloy layer and the interlayer insulation film with a thickness of 2-3 nm as the diffusion barrier film by utilizing a self-formation reaction occurring between the Mn atoms in the Cu—Mn alloy layer and the Si atoms and oxygen atoms in the interlayer insulation film.

FIGS. 1A-1E show the process of forming a Cu interconnection structure according to Patent Reference 3.

Referring to FIG. 1A, a Cu pattern 11A is embedded in an interlayer insulation film 11 via an ordinary barrier metal film 11B of Ta or TaN, and an interlayer insulation film 13 is formed on the interlayer insulation film 11 via an etching stopper film 12 of SiC or SiN. Further, an interlayer insulation film 15 is formed on the interlayer insulation film 13 via an etching stopper film 14 of SiC or SiN. In the state of FIG. 1A, an interconnection trench 15A is formed in the interlayer insulation film 15 so as to expose the interlayer insulation film 13 at the bottom part thereof, and a via hole 13A is formed in the interlayer insulation film 13 so as to expose the Cu interconnection patent 11A at a bottom part thereof.

Next, in the step of FIG. 1B, a Cu—Mn alloy layer 16 is formed in the structure of FIG. 1A by an evaporation deposition process or sputtering process with a thickness of several ten nanometers such that the Cu—Mn alloy layer 16 covers the sidewall surface and the bottom surface of the interconnection trench 15A continuously and in direct contact therewith and such that the Cu—Mn alloy layer 16 covers the sidewall surface and the bottom surface of the via-hole 13A continuously in direct contact therewith.

Further, in the step of FIG. 1C, electrolytic plating process of Cu is conducted while using the Cu—Mn alloy layer 16 as a seed layer, and there is formed a Cu layer 17 on the interlayer insulation film 15 so as to fill the interconnection trench 15A and the via-hole 13A.

Further, in the step of FIG. 1D, the structure of FIG. 1C is annealed in an oxygen gas ambient at a temperature of 400° C., for example, and there is formed a diffusion barrier film 18M of the composition represented as MnSixOy on the surfaces of the interconnection trench 15A and the via-hole 13A by causing the Mn atoms in the Cu—Mn layer 16 to react with Si atoms and oxygen atoms in the interlayer insulation films 13 and 15 that are exposed at the sidewall surfaces and bottom surfaces of the interconnection trench 15A and via-hole 13A.

Here, it should be noted that the reaction forming the MnSixOy diffusion barrier film 18M in the step FIG. 1D is a self-forming or self-organizing reaction characterized by a self-limiting process, and thus, growth of the MnSixOy film 18M stops spontaneously with the film thickness of 2-3 nm depending on the nature of the underlying layer. Thus, according to such a process, it becomes possible to form an extremely thin diffusion barrier film stably and reliably with an extremely uniform thickness.

It should be noted that, while the etching stopper film 14 is formed of SiC or SiN, such a film also contains a small amount of oxygen, and formation of the foregoing extremely thin MnSixOy diffusion barrier film 18M takes place also on the exposed surface of the etching stopper film 14 similarly. On the other hand, the Cu interconnection pattern 11A is subjected to a process of removing native oxide film by conducting a reverse sputtering process, or the like, in advance of the step of FIG. 1B, and thus, the Cu interconnection pattern 11A is free from oxygen. Thus, there occurs no formation of the diffusion barrier film 18M at the interface between the Cu interconnection pattern 11A and the Cu layer 17, and direct and excellent contact is secured between the Cu interconnection pattern and the Cu layer 17.

In the thermal annealing step of FIG. 1D, it should be noted that the Mn atoms contained in the Cu—Mn alloy layer 16 but not contributing to the reaction forming the MnSixoy layer 18M cause diffusion through the Cu layer 17 formed by the electrolytic plating process and forms a Mn oxide layer having a composition represented as MnxOy when reached the surface by causing reaction with oxygen in the ambient. It should be noted that this is because Mn has a larger ionization tendency over Cu. Further, with such diffusion of the Mn atoms, the boundary between the Mn—Cu layer 16 and the Cu layer 17 disappears.

Thus, with the step of FIG. 1D, not only the barrier metal film 18M is formed but there occurs precipitation of Mn atoms in the Cu layer 17 on the surface of the Cu layer in the form of the foregoing Mn oxide layer 18, and as a result, the Mn concentration in the Cu layer 17 is reduced, while this leads to decrease of the specific resistance of the Cu layer 17.

Further, in the step of FIG. 1E, excessive part of the Cu layer 17 on the interlayer insulation film 15 is removed by a CMP process together with the Mn oxide layer 18, and with this, a Cu pattern 18 is formed so as to fill the via-hole 13A and the interconnection trench 15A accompanied with a uniform MnSixoy diffusion barrier film 18M having a thickness of 2-3 nm.

With such a thermal annealing process of FIG. 1D, on the other hand, there is a possibility in view of the fact that the Mn oxide layer 18 formed on the surface of the Cu layer 17 is a solid phase material, that the reaction between the oxygen molecules in the ambient and the Mn atoms in the Cu layer 17 does not proceed satisfactorily when the Mn oxide layer 18 has grown to a certain thickness. Thereby, there is a concern that removal of the Mn atoms from the Cu layer 17 may not proceed satisfactorily. Further, with the thermal annealing process of FIG. 1D, there is a possibility that oxygen in the ambient may penetrate into the Cu layer in the initial phase of the reaction and form a stable oxide in the Cu layer 17 by causing reaction with the Mn atoms therein.

FIG. 2 shows the change of the specific resistance of the Cu—Mn layer in the case of conducting the thermal annealing process of FIG. 1D in the oxygen gas ambient under various processing pressures, wherein it should be noted that the experiment of FIG. 2 is conducted by forming a continuous film of Cu—Mn alloy in an insulation film by a damascene process and by measuring the specific resistance thereof. It should be noted further that the experiment of FIG. 2 shows the examples of using a silicon oxide film (TOX) formed by a CVD process while using a TEOS source, a porous MSQ (methyl silsesquioxane) film, an SiCN film, and an SiOC film, for the interlayer insulation film.

Referring to FIG. 2, it can be seen that the Cu—Mn alloy layer has a specific resistance of 9-10 μΩcm in the case no such thermal annealing process is conducted, while it can be seen also that the specific resistance can be decreased to 3-4 μΩcm by applying such a thermal annealing process.

On the other hand, the relationship of FIG. 2 indicates that, while there are some examples in which the specific resistance is decreased by increasing the processing pressure, it is generally difficult to achieve a specific resistance lower than the foregoing value of 3-4 μΩcm. Because the specific resistance of high-purity Cu film takes the value of about 1.67μΩ, the result of FIG. 2 indicates that there remains Mn in the Cu layer with substantial concentration even after the foregoing thermal annealing process.

Further, it can be seen that, in any of the experiments, the specific resistance starts to increase when the processing pressure is increased beyond $2 \times 10^{-2}$ Pa, while this suggests that the Cu atoms themselves start forming a Cu oxide film by reacting with oxygen atoms.

The result of FIG. 2 means that it is not possible to decrease the specific resistance of the Cu interconnection pattern 17A satisfactorily with the process of FIGS. 1A-1E.

According to a first aspect, the present invention provides a method for fabricating a semiconductor device, comprising the steps of:

forming an opening defined by an inner wall surface in an insulation film;

forming a Cu—Mn alloy layer in said opening;

depositing a Cu layer on said Cu—Mn alloy layer and filling said opening with said Cu layer; and forming a barrier layer as a result of reaction between Mn atoms in said Cu—Mn alloy layer and said insulation film, wherein said step of forming said barrier layer is conducted by exposing said Cu layer to an ambient that forms a gaseous reaction product when reacted with Mn.

In another aspect, the present invention provides a method for fabricating a semiconductor device, comprising the steps of:

forming an opening defined by an inner wall surface in an insulation film;

forming a Cu—Mn alloy layer in said opening;

forming a barrier layer on said inner wall surface as a result of reaction of Mn atoms in said Cu—Mn alloy layer and said insulation film; and depositing a Cu layer on said Cu—Mn alloy layer and filling said opening with said Cu layer, wherein said Cu layer is exposed to an ambient that forms a gaseous reaction product when reacted with Mn.

In another aspect, the present invention provides a method for fabricating a semiconductor device, comprising the steps of:

forming an opening defined by an inner wall surface in an insulation film;

forming a Cu—Mn alloy layer in said opening;

forming a barrier layer on said inner wall surface as a result of reaction between Mn atoms in said Cu—Mn alloy layer and said insulation film;

exposing said Cu—Mn alloy layer to an ambient that forms a gaseous reaction product when reacted with Mn; and depositing, after said step of exposing said Cu—Mn alloy layer to said ambient, a Cu layer on said Cu—Mn alloy layer and filing said opening with said Cu layer.

According to the present invention, it becomes possible, when forming an extremely thin diffusion barrier film containing Mn and oxygen on an inner wall surface of an opening formed in an insulation film by a self-forming reaction of Mn atoms in a Cu—Mn alloy layer formed in direct contact with said inner wall surface and said insulation film, to remove the excessive Mn atoms continuously and efficiently away from the system, by exposing the surface of the Cu—Mn alloy layer or the surface of the Cu layer formed on the Cu—Mn alloy layer to an ambient that forms a gaseous reaction product when reacted with Mn. Thereby, it becomes possible to reduce the specific resistance of the Cu interconnection pattern formed in such an opening effectively. Further, it becomes possible to improve the reliability of the process of filling the opening by electrolytic plating process conducted after formation of the barrier layer, by reducing the resistance of the Cu layer used for the seed layer.

Other objects and further features of the present invention will become apparent from the following detailed description when read in conjunction with the attached drawings.

BRIEF DESCRIPTION OF THE DRAWINGS

FIG. 2 is a diagram explaining the problem addressed by the present invention;

FIGS. 3A and 3B are diagrams showing the formation process of a self-forming barrier film according to a first embodiment of the present invention;

FIGS. 8A-8I are diagrams showing the fabrication process of a semiconductor device according to a third embodiment of the present invention;

FIGS. 10A-10D are diagrams showing the fabrication process of a semiconductor device according to a fifth embodiment of the present invention;

DETAILED DESCRIPTION OF THE INVENTION

First Embodiment

FIGS. 3A and 3B are diagrams explaining the formation process of a self-forming barrier film according to a first embodiment of the present invention.

Referring to FIG. 3A, a Cu—Mn alloy layer 63 containing Mn with a concentration of 5 atomic % is formed, with the present embodiment, on a silicon substrate 61 formed with a silicon oxide film 62 on a surface thereof, by a sputtering process with a film thickness of 60 nm.

Next, in the step of FIG. 3B, the structure of the FIG. 3A is annealed, and there is formed a barrier metal film 63M having a composition represented as $MnSi_xO_y$ at an interface between the silicon oxide film 62 and the Cu—Mn alloy layer 63 by a self-organization reaction explained previously with a film thickness of 2-3 nm.

According to the conventional technology of Patent Reference 3 explained previously with reference to FIGS. 1A-1E, it is not possible to separate and remove Mn satisfactorily from the remaining Cu—Mn layer as shown in FIG. 3, even in the case such a thermal annealing process is conducted in an oxygen gas ambient at the temperature of 400° C., and as a result, it has not been possible to reduce the specific resistance of the Cu layer formed on the Cu—Mn alloy layer below about 3-4 $\mu\Omega cm$.

Contrary to the foregoing, the inventor of the present invention has discovered, in the experiments that constitute the foundation of the present invention, that it becomes possible to remove Mn efficiently from the remaining Cu—Mn alloy layer 63 and to reduce the specific resistance thereof significantly, by conducting the thermal annealing process of FIG. 3B in an ambient containing a formic acid (HCOOH).

More specifically, the inventor of the present invention has conducted the thermal annealing process of FIG. 3B in the ambient of an Ar carrier gas of a flow rate of 300 SCCM wherein a formic acid (HCOOH) is added with a flow rate of 100 SCCM by way of bubbling, under the process pressure of 100 Pa for 30 minutes at the temperature of 350-400° C., and discovered that the specific resistance of the remaining Cu—Mn alloy layer 63 is reduced to about 2 $\mu\Omega cm$.

Figure 1A:
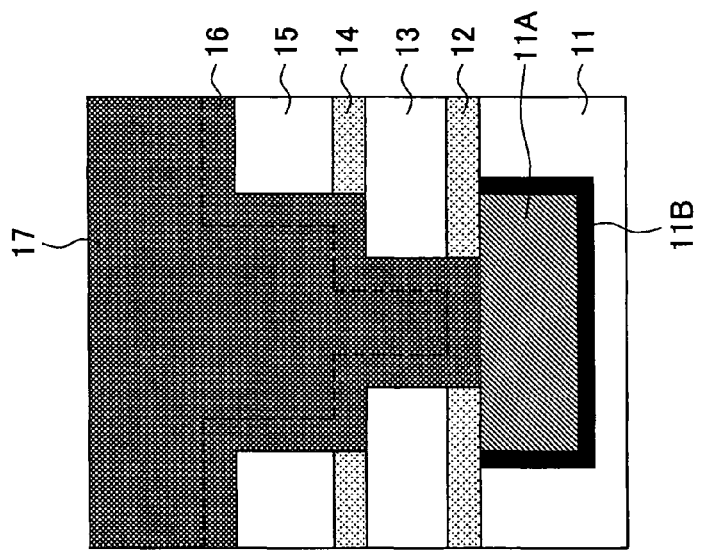
FIGS. 1A-1E are diagrams showing the process of forming a Cu interconnection structure according to a related art of the present invention.
Figure 1B:
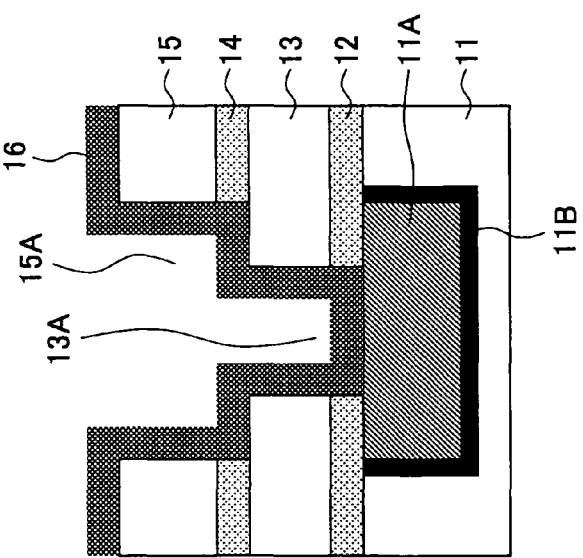
Figure 1C:
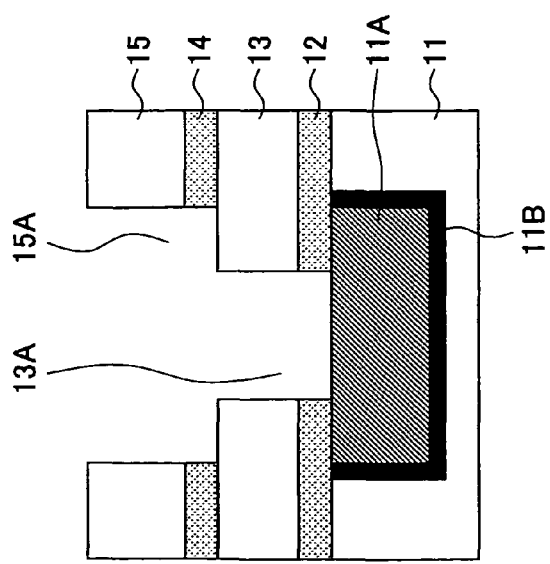
Figure 1D:
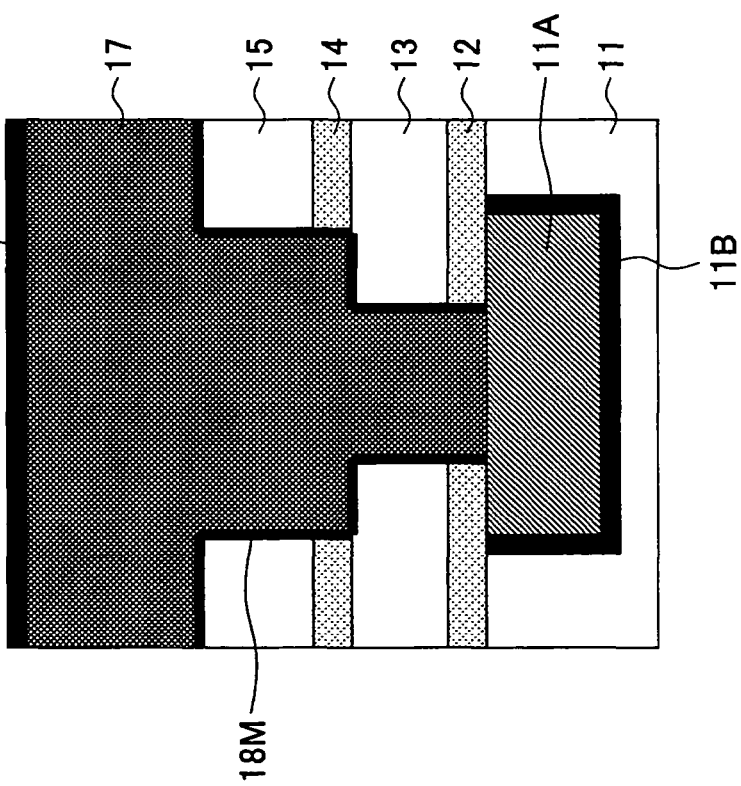
Figure 1E:
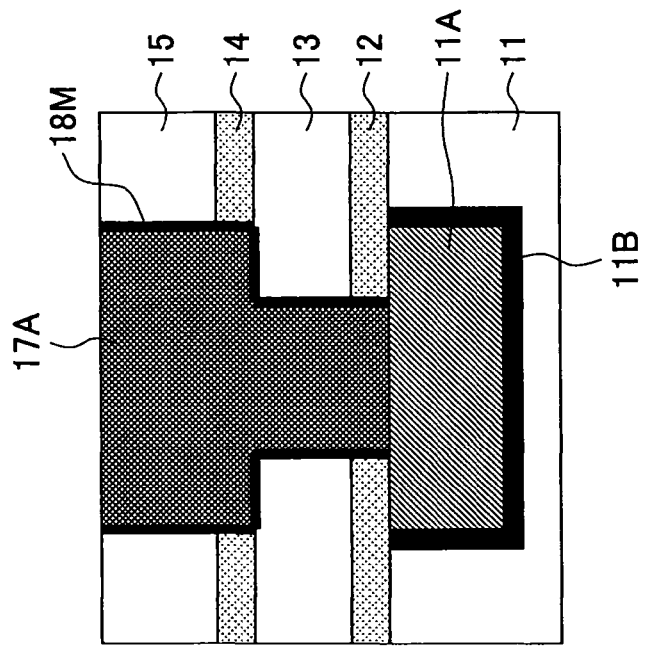
Figure 4:
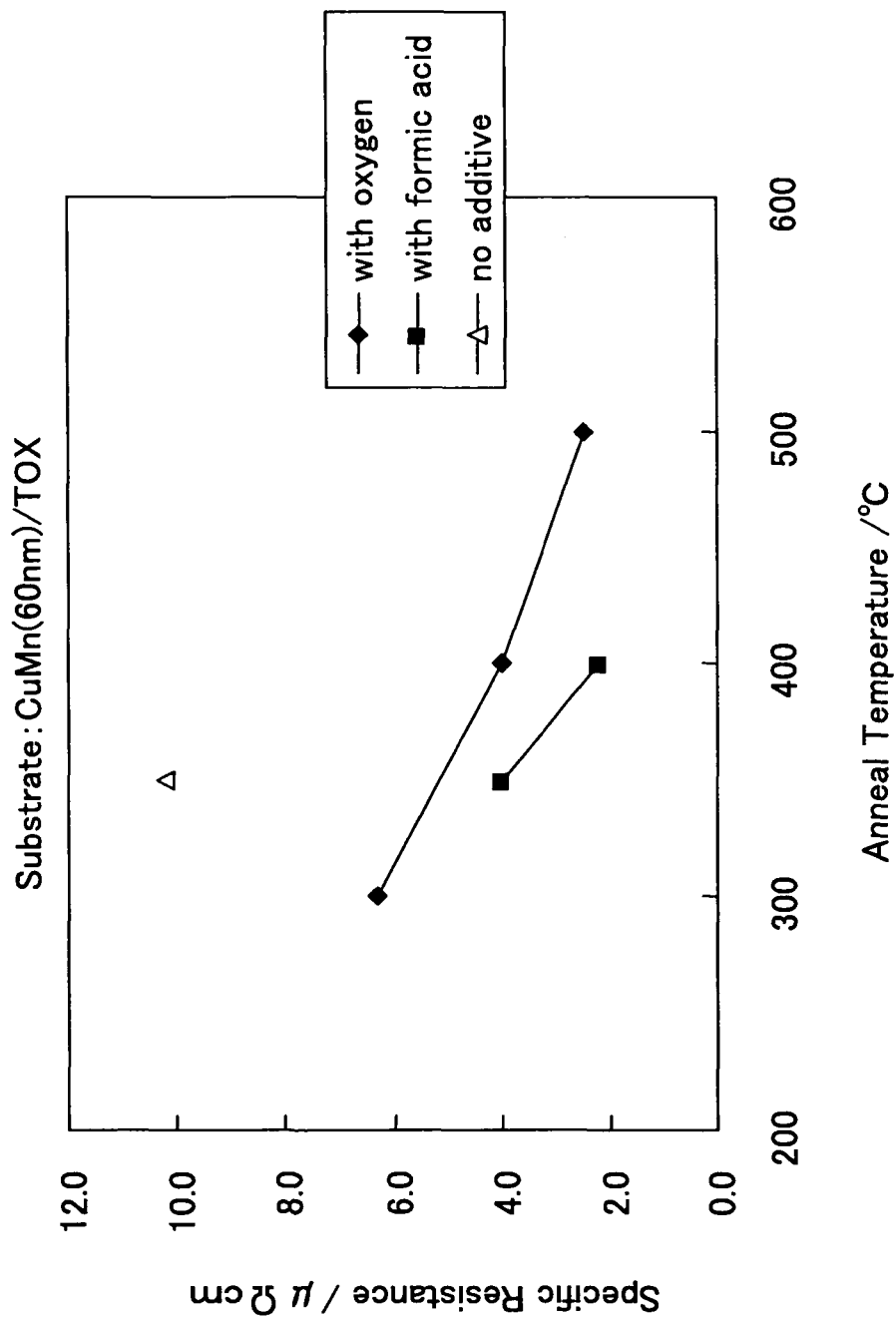
FIG. 4 is a diagram showing the relationship between a thermal annealing process temperature and a specific resistance of the Cu layer in the structure obtained with the process of FIGS. 3A and 3B.

FIG. 4 shows the relationship between the specific resistance and the thermal annealing temperature of the Cu—Mn alloy 63 in which the thermal annealing process of FIG. 3B is conducted in the ambient containing formic acid, in comparison with the case in which the thermal annealing process is conducted by adding an oxygen gas to the Ar carrier gas of the flow rate of 300 SCCM with the flow rate of 5 SCCM, and for the case in which the Ar carrier gas is added with no additional gas.

Referring to FIG. 4, it can be seen that the specific resistance of the Cu—Mn alloy layer 63 is reduced to 4 $\mu\Omega cm$ or less by conducting the thermal annealing process of FIG. 3B at the temperature of 350° C. or higher. Particularly, in the case the thermal annealing process is conducted at 400° C., it can be seen that the specific resistance of the Cu—Mn alloy layer 63 is reduced to about 2 μΩcm. This indicates that Mn in the Cu—Mn alloy layer 63 is removed efficiently to the outside of the system as a result of the reaction with the formic acid.

Further, FIG. 4 indicates that, because of the thermal annealing process of FIG. 3B being conducted in the ambient containing formic acid, there is caused a decrease in the Mn concentration level in the Cu—Mn alloy layer 63, and as a result, the Cu—Mn alloy layer 63 has changed the composition thereof to a composition close to Cu.

Contrary to the foregoing, in the case the thermal annealing process is conducted in the ambient in which the Ar carrier gas is added with oxygen, it can be seen that the specific resistance of the remaining Cu—Mn alloy layer 63 is reduced only to about 4 μΩcm even when the thermal annealing temperature of 400° C. is used. Even when the thermal annealing process is conducted at 500° C., the specific resistance can be reduced only to about 3μΩm.

Further, in the case the thermal annealing process is conducted in the Ar gas not added with oxygen, it can be seen that a very high specific resistance of about 10 μΩcm is obtained by the thermal annealing process at the temperature of 350° C.

The result of FIG. 4 also shows the possibility that the specific resistance of the Cu—Mn alloy layer 63 can be reduced further by conducting the thermal annealing process of the step of FIG. 3B in the ambient added with formic acid at the temperature exceeding 400° C. However, when such a thermal annealing process is conducted at the temperature exceeding 400° C., there is a possibility that problems are caused with regard to the heat resistance of the low-K dielectric films used for the interlayer insulation film or with regard to the impurity distribution profile in shallow diffusion regions. Thus, it is preferable that the thermal annealing temperature does not exceed 400° C.

Figure 5:
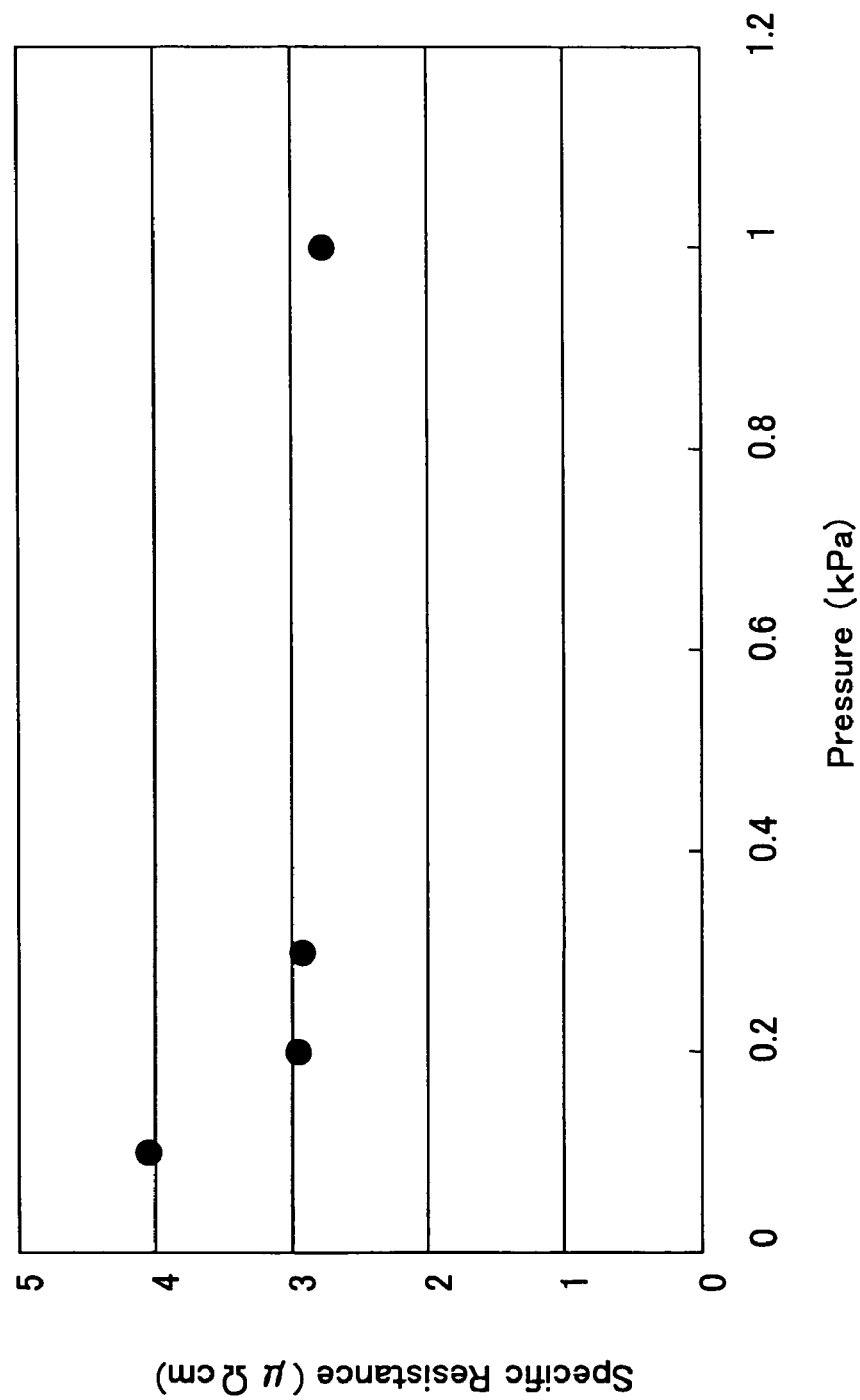
FIG. 5 is a diagram showing the relationship between a process pressure and a specific resistance of the Cu layer in the structure obtained with the process of FIGS. 3A and 3B.

FIG. 5 shows the relationship between the process pressure and the specific resistance of the Cu—Mn alloy layer 43 for the case of conducting the thermal annealing process of FIG. 3B in the ambient containing formic acid.

Referring to FIG. 5, it can be seen that the specific resistance of the Cu—Mn alloy layer 63 is reduced suddenly to 3 μΩcm or less in the case the thermal annealing process is conducted under the process pressure of 0.2 kPa or more. Here, it should be noted that, in the experiment of FIG. 5, the thermal annealing process is conducted at 350° C. for 30 minutes while supplying HCOOH with the flow rate of 150 SCCM.

Thus, from FIG. 5, it can be seen that the thermal annealing process of FIG. 3B is conducted preferably under the process pressure of 0.2 kPa or higher. Further, while the experiments of FIG. 5 have been conducted under the process pressure up to 1 kPa, similar desirable effects should be attained even when the process pressure is increased beyond 1 kPa. For example, the thermal annealing process may be conducted under the atmospheric pressure. Because HCOOH is supplied with the present invention, it is preferable to reduce the pressure at least in the evacuation side.

Second Embodiment

Figure 6A:
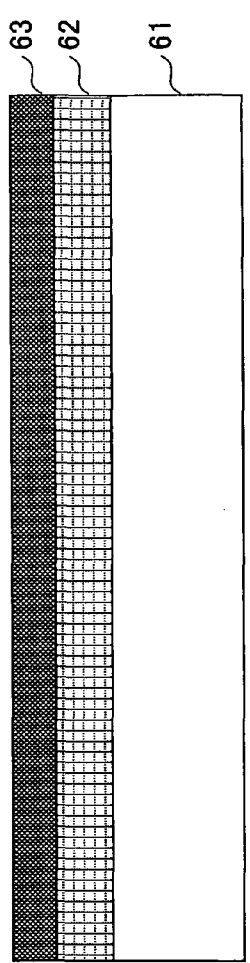
FIGS. 6A-6C are diagrams showing the formation process of a self-forming barrier film according to a second embodiment of the present invention.
Figure 6B:
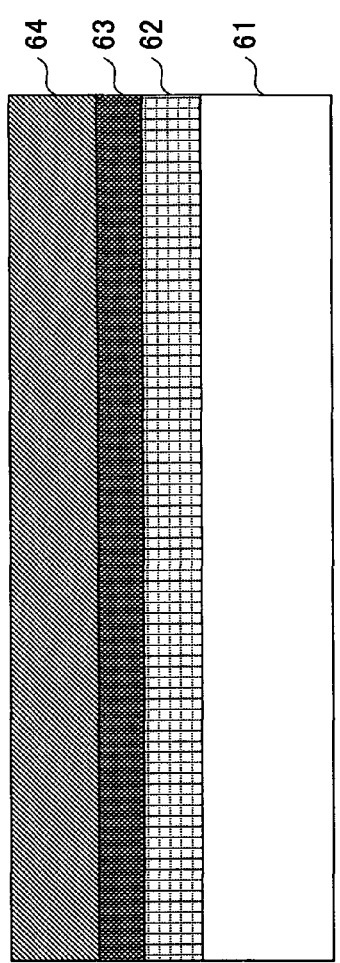
Figure 6C:
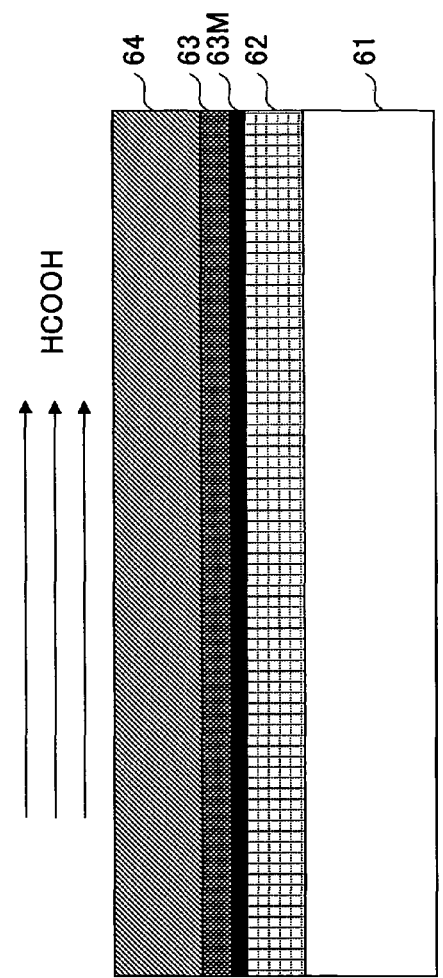

FIGS. 6A-6C are diagrams explaining the formation process of a self-forming barrier film according to a second embodiment of the present invention, wherein those parts corresponding to the parts explained previously are designated by the same reference numerals and the description thereof will be omitted.

Referring to FIG. 6A, a Cu—Mn alloy layer 63 is formed on a silicon oxide film 62, which in turn is formed on a silicon substrate 61, such that the Cu—Mn alloy layer 63 has a thickness of 60 nm, similarly to the process of FIG. 3A explained previously, and a Cu layer 64 is formed on the Cu—Mn alloy layer 63 in the step of FIG. 6B by an electrolytic plating process with a thickness of 300 nm while using the Cu—Mn alloy layer 63 as a seed layer.

Further, in the step of FIG. 6C, a thermal annealing process is applied to the structure of FIG. 6B and there is formed a barrier metal film 63M of the composition of MnSixOy at the interface between the silicon oxide film 62 and the Cu—Mn alloy layer 63 with a film thickness of 2-3 nm by the self-organization reaction explained previously. Thereby, with the present invention, it becomes possible to reduce the specific resistance of the Cu—Mn alloy layer 63 significantly by conducting the thermal annealing process of FIG. 6C in the ambient containing formic acid and thus by removing Mn from the remaining Cu—Mn alloy layer 63 via the Cu layer 64. As a result of such a thermal annealing process, the boundary between the Cu—Mn alloy layer 63 and the Cu layer 64 disappears similarly to the step of FIG. 1D.

Figure 7:
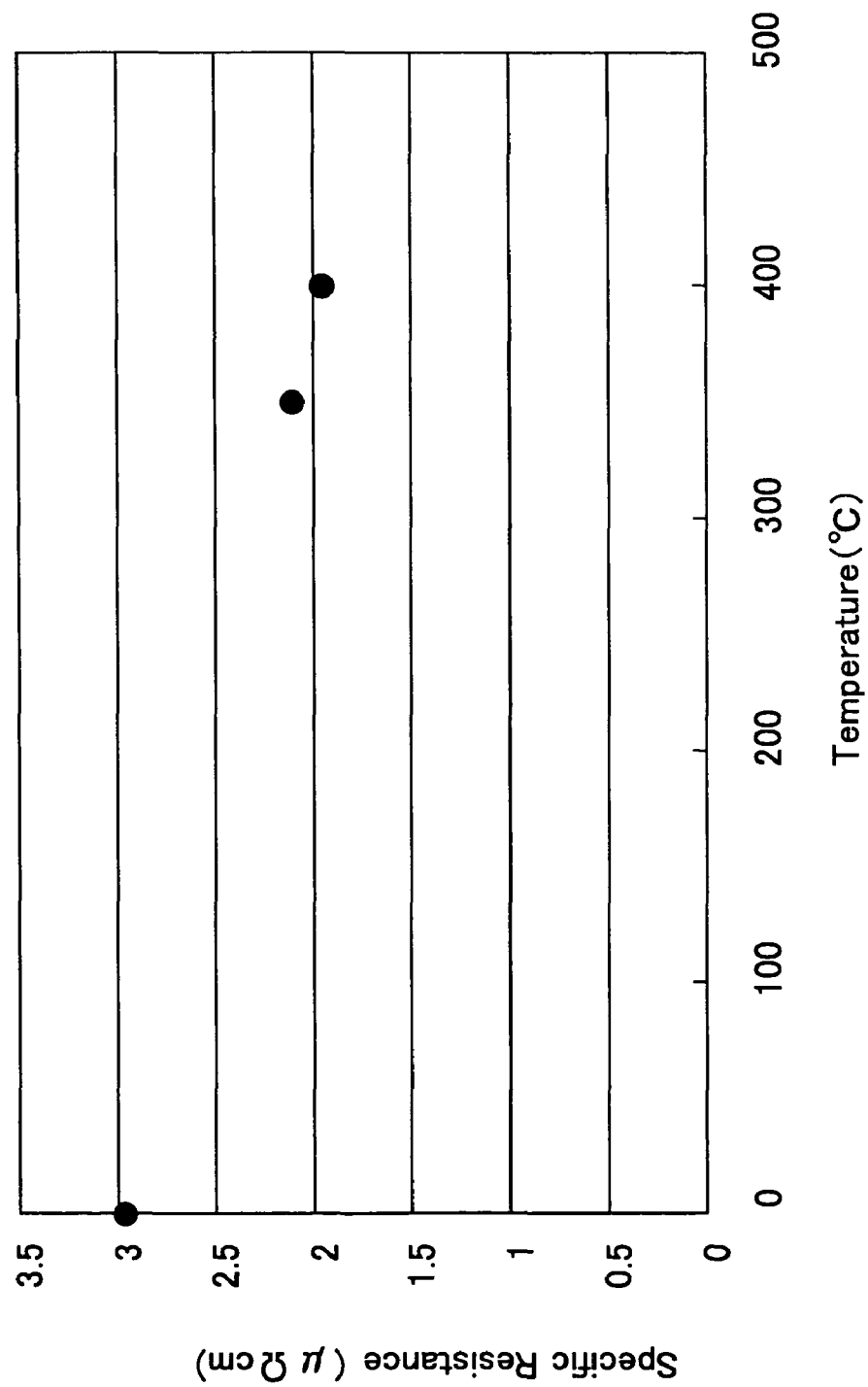
FIG. 7 is a diagram showing the relationship between a thermal annealing process temperature and a specific resistance of the Cu layer in the structure obtained with the process of FIGS. 6A-6C.

FIG. 7 shows the relationship between the specific resistance of the Cu—Mn alloy layer 63, and hence the Cu layer 64, and the thermal annealing temperature for the case in which the thermal annealing process of FIG. 6C is conducted in the ambient containing the formic acid in the temperature range from room temperature to 400° C. Here, it should be noted that, in the experiment of FIG. 7, the thermal annealing process is conducted under the pressure of 0.1 kPa in the ambient in which the formic acid is added to the Ar carrier gas of the flow rate of 300 SCCM by a bubbling process with a flow rate of 50 SCCM for the duration of 30 minutes.

Referring to FIG. 7, it can be seen that, as a result of such a thermal annealing process, the specific resistance is reduced to about 2 μΩcm with the thermal annealing process at 350° C. and to less than 2 μΩcm with the thermal annealing process at 400° C. Taking into consideration the facts that a bulk Cu has a theoretical value of specific resistance of 1.67 μΩcm as noted previously and that a Cu layer formed by an electrolytic plating process has the specific resistance of about 2 Ωcm, the foregoing results indicates that the specific resistance of the Cu—Mn alloy layer 63, and hence the specific resistance of the Cu layer 64, is reduced sufficiently as a result of the process of the present invention. In this case, too, it is preferable that the temperature of the foregoing thermal annealing process is 300° C. or higher but not exceeding 400° C., more preferably 350° C. or less.

Third Embodiment

FIGS. 8A-8I are diagrams showing the fabrication process of a semiconductor device according to a third embodiment of the present invention.

Referring to FIG. 8A, the semiconductor device of the present embodiment is a device of 45 nm mode and includes an interlayer insulation film 21 formed on a substrate not illustrated, wherein there is formed a Cu interconnection pattern 21A of a width of 65 nm, for example, in the interlayer insulation film 21 via an ordinary barrier metal film 21 of Ta, TaN, or the like.

On the interlayer insulation film 21, there is formed an interlayer insulation film 23 via an etching stopper film 22 of SiC or SiN formed by a plasma CVD process with a thickness of 10-50 nm, and another interlayer insulation film 25 is formed further on the interlayer insulation film 23 via another etching stopper film 24 of SiC or SiN formed by a plasma CVD process with a thickness of 10-100 nm, wherein the interlayer insulation films 23 and 25 are formed by a plasma CVD process with a thickness of 100-300 nm while using a TEOS source material.

Next, in the step of FIG. 8B, an interconnection trench 25A is formed in the interlayer insulation film 25 with a width of 65 nm, for example, so as to expose the etching stopper film 24, and an opening 24A is formed in the exposed etching stopper film 24 in the interconnection trench 25A in the step of FIG. 8C with a diameter of 65 nm in correspondence to the via-hole to be formed, such that the interlayer insulation film 23 is exposed at the opening 24A.

Further, in the step of FIG. 8D, a via-hole 23A is formed in the interlayer insulation film 23 with a diameter of 65 nm, for example, while using the etching stopper film 24A as a hard mask, and in the step of FIG. 8E, the etching stopper film 24 exposed at the bottom of the interconnection trench 25A and the etching stopper film 22 exposed at the bottom of the via-hole 23A are removed simultaneously. With this the interconnection pattern 21A is exposed.

Next, in the step of FIG. 8F, a Cu—Mn alloy layer 26 containing Mn with a concentration of 0.1-10 atomic percent, such as 5 atomic percent, is formed on the structure of FIG. 3E by a sputtering process with a thickness of 10-150 nm such as 50 nm, such that the Cu—Mn alloy layer 26 covers the sidewall surface and bottom of the interconnection trench 25A and the sidewall surface and the bottom of the via-hole 23A continuously and directly. Here, it should be noted that the Cu—Mn alloy layer 26 can be formed, in addition to sputtering process, by CVD process or ALD (atomic layer deposition) process.

Figure 8I:
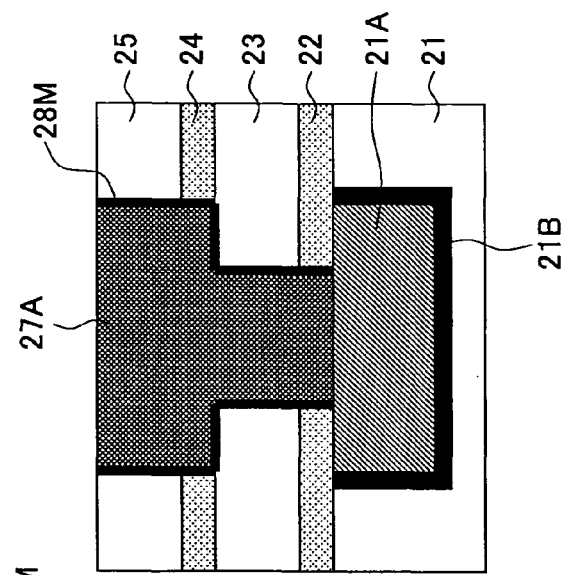
Figure 8H:
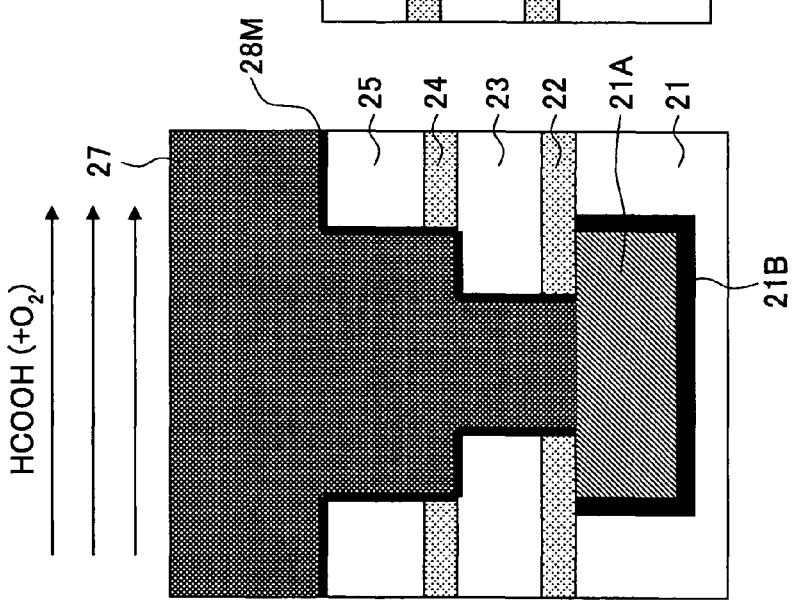
Figure 8G:
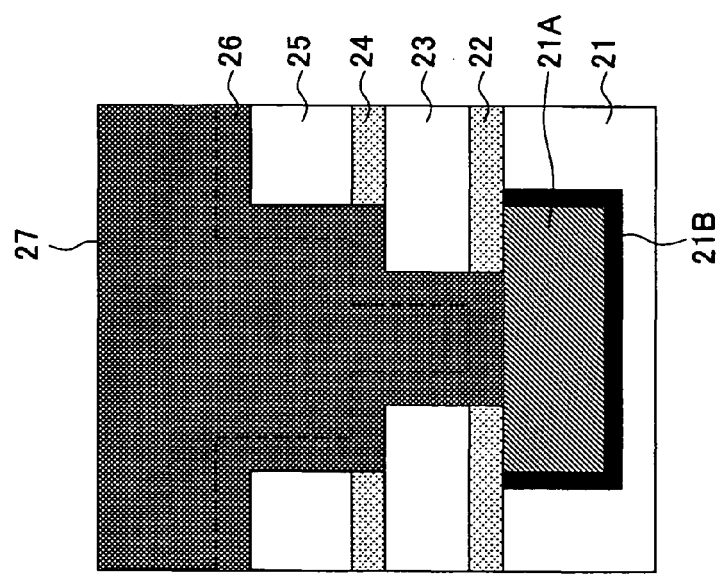

The Cu—Mn alloy layer 26 thus formed has a shape conformal to the shape of the interconnection trench 25A and the via-hole 23A, and a Cu layer 27 is formed in the step of FIG. 8G so as to fill the interconnection trench 25A and the via-hole 23A by conducting an electrolytic plating process while using the Cu—Mn alloy layer 26 for the seed layer.

Next, in the step of FIG. 8H, the structure of FIG. 8G is held in an ambient in which a formic acid (HCOOH) is added to an Ar carrier gas supplied with a flow rate of 300 SCCM, with a flow rate of 100 SCCM, under a processing pressure of 10-1000 Pa such as 100 Pa, and a thermal annealing process is conducted at a temperature of 100° C. or higher but not exceeding 400° C., for the duration of 10-3600 seconds, such as 360 seconds.

As a result of such a thermal annealing process, the Mn atoms in the Cu—Mn layer 26 cause reaction with the Si atoms and the oxygen atoms forming the exposed interlayer insulation films 23 and 25 at the sidewall surface and the bottom surface of the interconnection trench 25A and at the sidewall surface of the via-hole 23A, and as a result, there is formed a diffusion barrier film 23M of the composition MnSixOy on the surface of the interconnection trench 25A and the via-hole 23A.

In the step of FIG. 8H, it should be noted that the Mn atoms released from the Cu—Mn alloy layer 26 cause diffusion into the Cu layer 27 during such a thermal annealing process, and as a result, the boundary between the Cu—Mn alloy layer 26 and the Cu layer 27 disappears.

The Mn atoms thus caused diffusion into the Cu layer 27 cause a reaction:

$$2HCOOH + Mn \rightarrow Mn(HCOO)_2 + H_2, \tag{1}$$

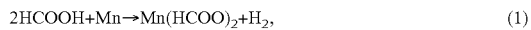

with the formic acid (HCOOH) of the ambient when reached the surface of the Cu layer 27. Because the reaction product $Mn(HCOO)_2$ and $H_2$ are gaseous material, it will be noted that Mn is removed from the Cu layer 27, and hence from the system, continuously in the form of gaseous reaction product.

In the step of FIG. 8H, it is also possible to add an oxygen gas to the formic acid ambient.

In this case, a manganese oxide ($MnO_2$) is formed as a result of reaction between the Mn atoms and oxygen at the surface of the Cu layer, wherein the manganese oxide also form gaseous reaction products of $Mn(HCOO)_2$, $H_2O$ and $O_2$ when reacted with the formic acid according to the reaction:

$$4HCOOH + 2MnO_2 \rightarrow 2Mn(HCOO)_2 + 2H_2O + O_2. \tag{2}$$

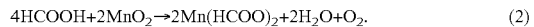

Thus, Mn is removed from the Cu layer 27, and hence from the system continuously also in the present case.

With the step of FIG. 8H, it is also possible to use an ambient containing carboxylic acid such as acetic acid ($CH_3COOH$), in addition to formic acid. Further, it is possible to use ambient other than the carboxylic acid such as hexafluoroacetylacetonato, $H_2O$ or $CO_2$.

Finally, in the step of FIG. 8I, excessive part of the Cu layer 27 on the interlayer insulation film 25 is removed by a chemical mechanical polishing process until the interlayer insulation film 25 is exposed, and with this an interconnection structure is obtained such that a Cu interconnection pattern 27A is embedded in the interconnection trench 25A.

Measurement of specific resistance conducted on a test piece revealed that the Cu interconnection pattern 27A thus obtained has a specific resistance of 1.9 μΩcm, while this value of specific resistance is about one-half of the specific resistance observed with the experiment of FIG. 2.

With the present embodiment, it should be noted that the interlayer insulation films 23 and 25 are by no means limited to the TEOS-CVD film ($SiO_2$ film) explained above, but the technology of the present invention of forming diffusion barrier film is applicable also to other low-K insulation films including inorganic SOD (spin-on-dielectric) films and organic SOG (spin-on-glass) films, such as an SiC film formed by CVD (chemical vapor deposition) process, an SiOC film, an SiOCH film, an SiOF film, or porous films thereof. Further, the present invention is applicable also to a low-K organic insulation film such as an aromatic polyether film, which does not contain oxygen in a nominal composition, as long as the film contains oxygen with the amount sufficient to form the extremely thin Mn oxide film by the self-forming process.

In the case the interlayer insulation film does not contain Si, the diffusion barrier film 18M becomes a film of the composition of MnxOy.

With the present embodiment, it should further be noted that the step of FIG. 8H may be repeated plural times. Thereby, the Cu layer 27 is exposed repeatedly to the ambient that forms the gaseous reaction product by reacting with Mn or Mn oxide, and it becomes possible to decrease the concentration of Mn in the Cu layer 27 further.

Fourth Embodiment

Next, the process of forming a Cu interconnection structure according to a second embodiment of the present invention will be described with reference to FIGS. 9A-9C, wherein those parts corresponding to the parts described previously are designated by the same reference numerals and the description thereof will be omitted.

Figure 9A:
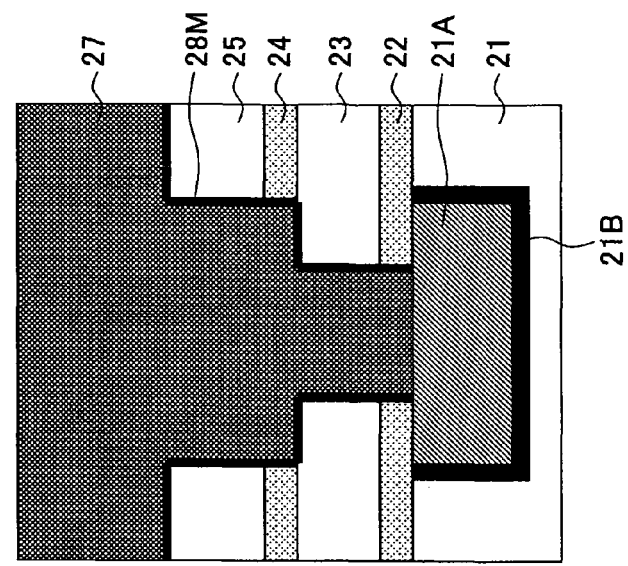
FIGS. 9A-9C are diagrams showing the fabrication process of a semiconductor device according to a fourth embodiment of the present invention.

With the present embodiment, a structure corresponding to the structure of FIG. 8F is formed on the structure of FIG. 8E in the step of FIG. 9A by forming a Cu—Mn alloy layer 26 containing Mn with a concentration of 0.1-10 atomic percent, such as 5 atomic percent, by way of a sputtering process with a thickness of 10-150 nm, such as 50 nm, according to a series of process steps explained with the previous embodiment.

Figure 9B:
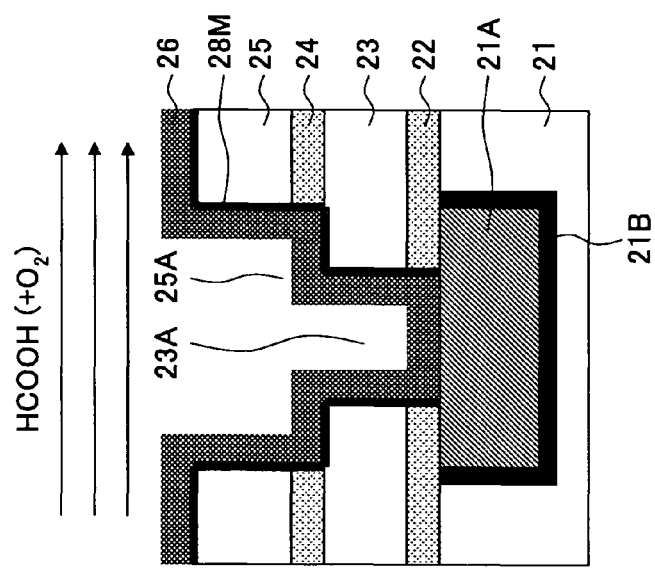

Further, in the step of FIG. 9B, the Cu—Mn alloy layer 26 is annealed at a temperature of 100° C. or higher but not exceeding 300° C., such as 250° C., in an ambient in which an Ar carrier gas supplied with a flow rate of 300 sccm is added with a formic acid supplied with a flow rate of 50 sccm, under a pressure of 100 Pa for a duration of 1-30 minutes, such as 1 minute.

As a result of such a thermal annealing process, the Mn atoms in the Cu—Mn layer 26 cause reaction with the Si atoms and oxygen atoms of the interlayer insulation films 23 and 25 exposed at the sidewall surface and bottom surface of the interconnection trench 25A or at the sidewall surface of the via-hole 23A, and there is formed an extremely thin diffusion barrier film 28M of the composition of MnSixoy on the surface of the interconnection trench 25A and further on the surface of the via-hole 23A with the thickness of 2-3 nm by a self-forming reaction similarly to the previous embodiment.

Because the step of FIG. 9B is conducted with the present embodiment in the ambient containing HCOOH, the Mn atoms in the Cu—Mn layer 26 are removed promptly from the system according to the reaction (1) explained before, and the composition of the Cu—Mn layer 26 approaches to that of pure Cu. Further, in the case oxygen gas is added to the ambient, the Mn atoms are removed according to the reaction (2) explained before.

Figure 9C:
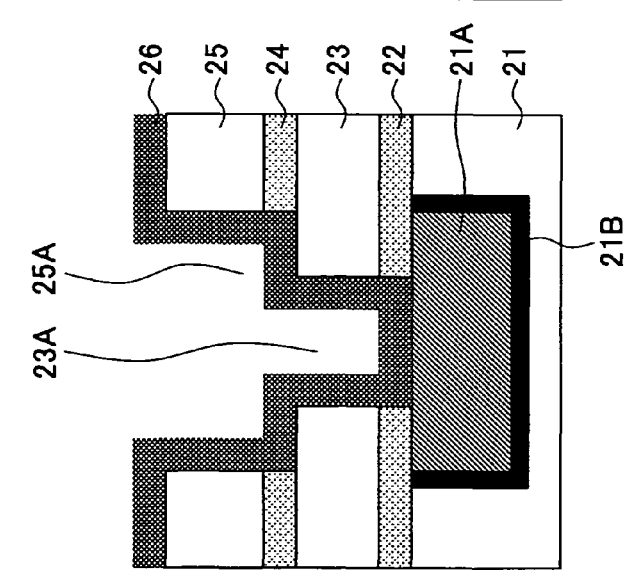

With the present embodiment, electrolytic plating process is conducted further in the step of FIG. 9C while using the Cu layer 26 of FIG. 9B for the seed layer, and the via-hole 23A and the interconnection trench 23A of FIG. 4B are filled with a Cu layer 27.

After the step of FIG. 9C, excessive Cu layer 27 on the interlayer insulation film 25 is removed by a chemical mechanical polishing process similar to that of FIG. 8I, and a Cu interconnection structure similar to that of FIG. 8I is obtained.

Because the removal of remaining Mn in the Cu—Mn layer 26 is conducted in the step of FIG. 9B with the present embodiment, removal is conducted efficiently, and it becomes possible to reduce the Mn concentration in the Cu layer 27 in the step of FIG. 9C effectively.

With the present embodiment, too, it is possible to repeat the process of FIG. 9B plural times. Thus, by repeatedly exposing the Cu—Mn alloy layer 26 after formation of the diffusion barrier layer 28M to the ambient that forms a gaseous reaction product with reaction with Mn or Mn oxide, it becomes possible to reduce the concentration of Mn remaining in the Cu—Mn alloy layer 26 further, and as a result, it becomes possible to reduce the concentration of Mn in the Cu layer 27 in the step of FIG. 9C further.

Fifth Embodiment

Next, the process of forming a Cu interconnection structure according to a third embodiment of the present invention will be described with reference to FIGS. 10A-10D, wherein those parts corresponding to the parts explained previously are designated by the same reference numerals and the description thereof will be omitted.

With the present embodiment, a structure corresponding to the structure of FIG. 8F is formed on the structure of FIG. 8E in the step of FIG. 10A by forming the Cu—Mn alloy layer 26 containing Mn with a concentration of 0.1-10 atomic percent, such as 5 atomic percent, by way of sputtering with a thickness of 10-150 nm, such as 50 nm according to a series of process steps explained with the previous embodiment.

Next, in the step of FIG. 10B, the structure of FIG. 10A is held in an Ar ambient under the pressure of 10-1000 Pa, such as 100 Pa, and a thermal annealing is conducted at a temperature of 100° C. or higher but not exceeding 400° C., such as 300° C., for the duration of 10-3600 seconds, such as 360 seconds. With this, a diffusion barrier film 28M of the composition of MnSixOy is formed at the interface between the Cu—Mn alloy layer 26 and the interconnection trench 25A or the via hole 23A with a thickness of 2-3 nm.

Figure 10D:
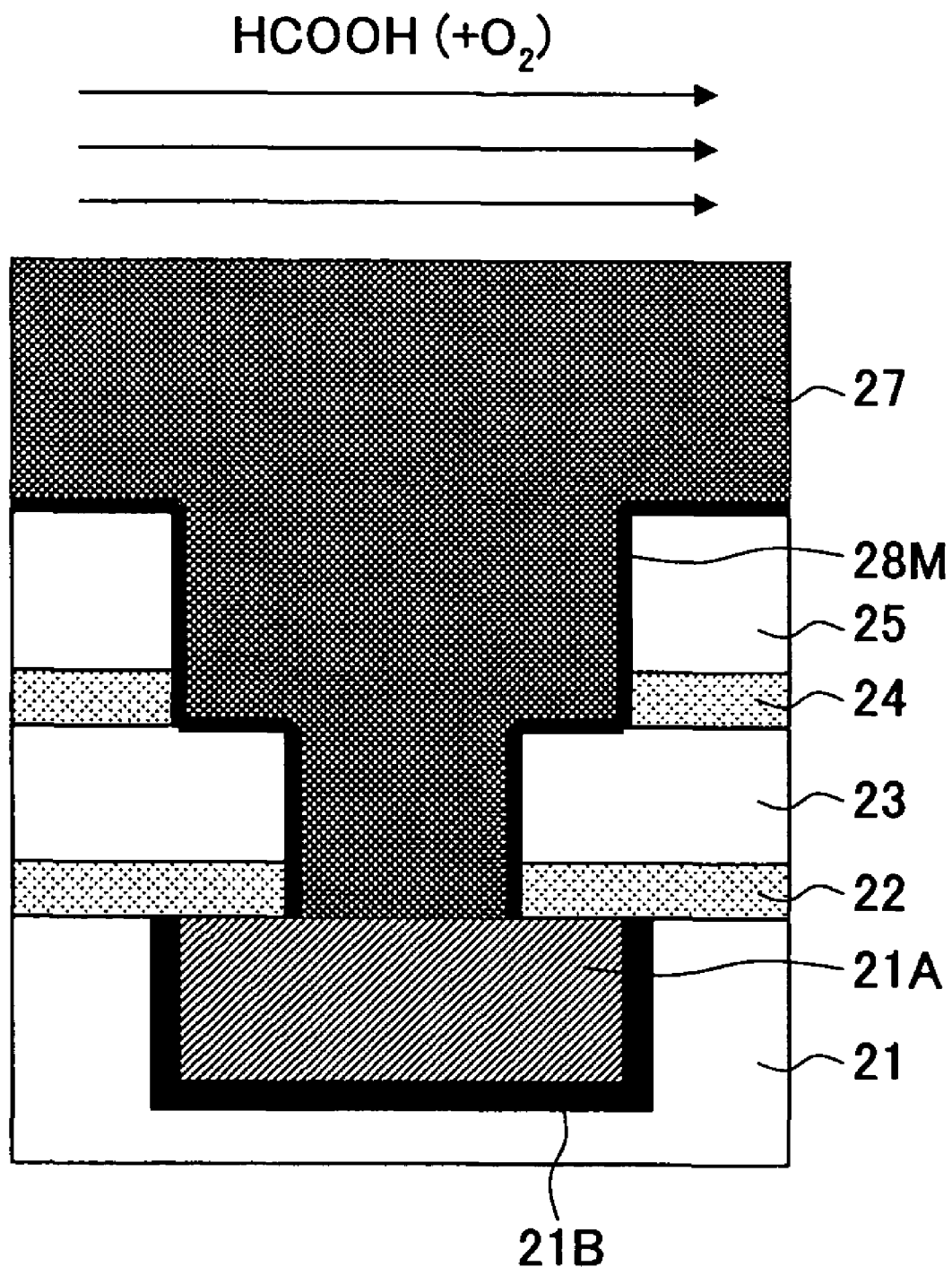

Next, in the step of FIG. 10C, the interconnection trench 25A and the via-hole 23A of the structure of FIG. 10B is filled with a Cu layer 27, and the structure of FIG. 10C is subjected to a thermal annealing process in the step of FIG. 10D under the processing pressure of 10-1000 Pa, such as 100 Pa, at the temperature of 100° C. or higher but not exceeding 400° C., such as 300° C., in an ambient in which an Ar carrier gas supplied with a flow rate of 300 sccm is added with a formic acid (HCOOH) and an oxygen gas supplied with respective flow rates of 10-100 sccm and 1-10 sccm, for the duration of 10-3600 seconds, such as 360 seconds.

As a result of the step of FIG. 10D, the Mn atoms contained in the Cu layer 27 promptly form a gaseous reaction product, when reached the surface of the Cu layer 27, by causing reaction with HCOOH or HCOOH and oxygen according to the reaction (1) or (2) explained before, and with this, Mn in the Cu layer 27 is removed from the system promptly.

With the present embodiment, too, it is possible to reduce the concentration of Mn contained in the Cu layer 27 further, by conducting the step of FIG. 10D repeatedly.

Sixth Embodiment

Figure 11:
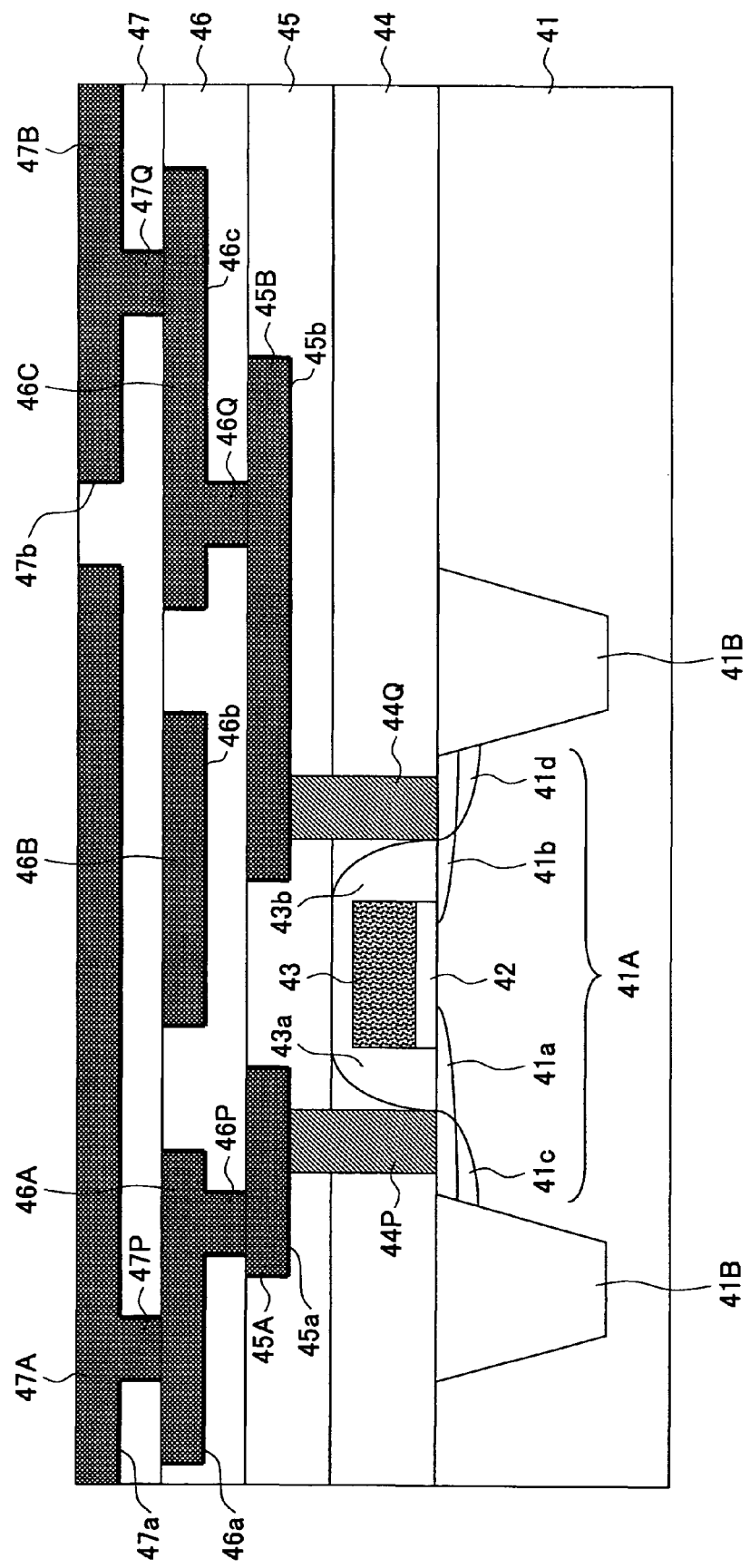
FIG. 11 is a diagram showing the construction of a semiconductor device according to a fourth embodiment of the present invention.

FIG. 11 shows the construction of a semiconductor device 40 having a Cu multilayer interconnection structure formed according to the process of the present invention.

Referring to FIG. 11, the semiconductor device 40 is formed in a device region 41A defined in a silicon substrate 41 by a device isolation structure 41B and includes a gate electrode formed on the silicon substrate 41 via a gate insulation film 42 and a pair of diffusion regions 41a and 41b formed in the silicon substrate 41 at respective sides of the gate electrode 43.

The gate electrode 43 has respective sidewall surfaces covered by sidewall insulation films 43a and 43b, and an interlayer insulation film 44 of a CVD-SiO$_2$ film or a low-K dielectric film having a composition represented as SiOC, SiOCH, or the like, is formed on the silicon substrate 41 so as to cover the gate electrode 43 and the sidewall insulation films 43a and 43b. Further, source and drain diffusion regions 41c and 41d are formed in the device region 41A of the silicon substrate 41 at respective outer sides of the sidewall insulation films 43a and 43b.

On the interlayer insulation film 44, there is formed a similar low-K interlayer insulation film 45, wherein Cu interconnection patterns 45A and 45B are embedded in the interlayer insulation film 45 via a diffusion barrier film 45a or 45b formed as a continuous film of the composition of MnSixOy or MnxOy according to the process of any of the preceding embodiments with the thickness of 2-3 nm. Thereby, the Cu interconnection patterns 45A and 45B are connected electrically to the diffusion regions 41c and 41d via contact plugs 44P and 44Q of tungsten (W), for example.

The Cu interconnection patterns 45A and 45B are further covered by another low-K interlayer insulation film 46 formed on the interlayer insulation film 45, and a further low-K interlayer insulation film 47 is formed on the interlayer insulation film 46.

With the illustrated example, Cu interconnection patterns 46A-46C are embedded in the interlayer insulation film 46 via respective diffusion barrier films 46a-46c similar to the diffusion barrier films 45a and 45b, and Cu interconnection patterns 47A and 47B are embedded in the interlayer insulation film 47 via respective diffusion barrier films 47a and 47b similar to the diffusion barrier films 45a and 45b. Thereby, the interconnection patterns 46A and 46C are connected respectively to the interconnection patterns 45A and 45B via via-plugs 46P and 46Q, and the interconnection patterns 47A and 47B are connected respectively to the interconnection patterns 46A and 46C via via-plugs 47P and 47Q.

In the illustrated example, the via-plugs 46P and 46Q are formed respectively as a part of the Cu interconnection pattern 46A and the Cu interconnection pattern 46B by a dual damascene process, and the via-plugs 47P and 47Q are formed respectively as a part of the Cu interconnection 47A and the Cu interconnection pattern 47B also by a dual damascene process.

According to the present invention, it becomes possible to form for form an extremely thin diffusion barrier film for each of the Cu interconnection patterns simultaneously to the formation of the seed layer in the form of a continuous film by a self-forming or self-organizing reaction characterized by self-limiting effect, and it becomes possible to secure low interconnection resistance and contact resistance even when the interconnection patterns are miniaturized. Further, there is no longer the need of forming a barrier metal film by a separate process, and the fabrication process of the semiconductor device is substantially simplified. It should be noted, however, that the present invention does not negate the mode of providing a barrier metal film such as a Ta film or W film, and the present invention is applicable also in the case of forming a hybrid barrier metal film such as the one in which a Ta film, a Cu—Mn alloy film and a Cu film are laminated consecutively.

In each of the foregoing embodiments, the Cu—Mn alloy layers 16 and 26 may contain one or more, other elements in addition to Cu and Mn.

While the present invention has been explained for preferred embodiments, the present invention is by no means limited to the embodiments described heretofore, but various variations and modifications may be made without departing from the scope of the invention.

What is claimed is:

1. A method for fabricating a semiconductor device, comprising:
    forming an opening defined by an inner wall surface in an insulation film;
    forming a Cu—Mn alloy layer in said opening;
    depositing a Cu layer on said Cu—Mn alloy layer and filling said opening with said Cu layer; and
    forming a barrier layer as a result of reaction between Mn atoms in said Cu—Mn alloy layer and said insulation film,
    wherein said forming said barrier layer is conducted by exposing said Cu layer to a gaseous ambient that reacts with Mn and forms a gaseous reaction product of Mn, said gaseous reaction product of Mn being a gaseous material,
    said gaseous ambient containing any of a formic acid, a carboxylic acid, hexafluoroacetylacetonato, $H_2O$, and $CO_2$.

2. The method as claimed in claim 1, wherein said ambient oxidizes Mn.

3. The method as claimed in claim 2, wherein said ambient reacts with Mn oxide and forms the gaseous reaction product.

4. The method as claimed in claim 1, wherein said exposing said Cu layer is conducted at a temperature of 100° C. or higher but not exceeding 400° C.

5. The method as claimed in any of claim 1, wherein said exposing said Cu layer is conducted under a process pressure of 1-1000 Pa.

6. A method for fabricating a semiconductor device, comprising:
    forming an opening defined by an inner wall surface in an insulation film;
    forming a Cu—Mn alloy layer in said opening;
    forming a barrier layer on said inner wall surface as a result of reaction of Mn atoms in said Cu—Mn alloy layer and said insulation film; and
    depositing a Cu layer on said Cu—Mn alloy layer and filling said opening with said Cu layer,
    wherein said Cu layer is exposed to a gaseous ambient that reacts with Mn and forms a gaseous reaction product of Mn, said gaseous reaction product of Mn being a gaseous material,
    said gaseous ambient containing any of a formic acid, a carboxylic acid, hexafluoroacetylacetonato, $H_2O$, and $CO_2$.

7. The method as claimed in claim 6, wherein said ambient oxidizes Mn.

8. The method as claimed in claim 7, wherein said ambient reacts with Mn oxide and forms the gaseous reaction product.

9. The method as claimed in claim 6, wherein said exposing of said Cu layer is conducted at a temperature of 100° C. or higher but not exceeding 400° C.

10. The method as claimed claim 6, wherein said exposing of said Cu layer is conducted under a process pressure of 1-1000 Pa.

11. A method for fabricating a semiconductor device, comprising:
    forming an opening defined by an inner wall surface in an insulation film;
    forming a Cu—Mn alloy layer in said opening;
    forming a barrier layer on said inner wall surface as a result of reaction between Mn atoms in said Cu—Mn alloy layer and said insulation film;
    exposing said Cu—Mn alloy layer to a gaseous ambient that reacts with Mn and forms a gaseous reaction product of Mn, said gaseous reaction product of Mn being a gaseous material,
    said gaseous ambient containing any of a formic acid, a carboxylic acid, hexafluoroacetylacetonato, $H_2O$, and $CO_2$; and
    depositing, after said step of exposing said Cu—Mn alloy layer to said ambient, a Cu layer on said Cu—Mn alloy layer and filing said opening with said Cu layer.

12. The method as claimed in claim 11, wherein said forming of said barrier layer and said exposing of said Cu—Mn alloy layer to said ambient are conducted simultaneously.

13. The method as claimed in claim 11, wherein said exposing of said Cu—Mn alloy layer to said ambient is conducted after said step of forming said barrier layer.

14. The method as claimed in claim 11, wherein said ambient oxidizes Mn.

15. The method as claimed in claim 14, wherein said ambient reacts with Mn oxide and forms the gaseous reaction product of Mn.

16. The method as claimed in any of claims 11, wherein said exposing of said Cu layer is conducted at a temperature of 100° C. or higher but not exceeding 400° C.

17. The method as claimed in claim 11, wherein said exposing of said Cu layer is conducted under a process pressure of 1-1000 Pa.

* * * * *